United States Patent [19]
Cheung et al.

[11] Patent Number: 5,817,406
[45] Date of Patent: Oct. 6, 1998

[54] CERAMIC SUSCEPTOR WITH EMBEDDED METAL ELECTRODE AND BRAZING MATERIAL CONNECTION

[75] Inventors: David W. Cheung, Foster City; Mark A. Fodor, Los Gatos; Christopher Lane, Sunnyvale, all of Calif.; Ryusuke Ushikoshi, Gifu, Japan; Hideyoshi Tsuruta; Tomoyuki Fujii, both of Nagoya, Japan

[73] Assignee: Applied Materials, Inc., Santa Clara, Calif.

[21] Appl. No.: 591,333

[22] Filed: Jan. 24, 1996

Related U.S. Application Data

[63] Continuation of Ser. No. 503,910, Jul. 14, 1995, abandoned.

[51] Int. Cl.$^6$ .................................. H05B 6/10; B32B 3/00
[52] U.S. Cl. ......................... 428/210; 228/124.5; 156/89; 156/91; 219/385; 219/634; 219/649; 219/759; 219/774
[58] Field of Search ............................. 428/210; 219/385, 219/634, 649, 759, 774; 156/91, 89; 228/124.5

[56] References Cited

U.S. PATENT DOCUMENTS

| | | | |
|---|---|---|---|
| 4,699,310 | 10/1987 | Kohno et al. | 228/122 |
| 4,749,118 | 6/1988 | Yokoi et al. | 228/208 |
| 5,158,659 | 10/1992 | Suzuki et al. | 204/279 |
| 5,231,690 | 7/1993 | Soma et al. | 392/416 |
| 5,280,156 | 1/1994 | Niori et al. | 219/385 |
| 5,306,895 | 4/1994 | Ushikoshi et al. | 219/385 |

FOREIGN PATENT DOCUMENTS

| | | | |
|---|---|---|---|
| 61-171128 | 8/1986 | Japan | H01L 21/302 |
| 62-72577 | 4/1987 | Japan . | |
| 62-182166 | 8/1987 | Japan . | |
| 63-95644 | 4/1988 | Japan | H01L 21/68 |
| 1-200625 | 8/1989 | Japan | H01L 21/302 |
| 3-194948 | 8/1991 | Japan | H01L 21/68 |
| 3-217043 | 9/1991 | Japan | H01L 21/68 |
| 3-255625 | 11/1991 | Japan | H01L 21/302 |
| 3-255626 | 11/1991 | Japan | H01L 21/302 |
| 4-34953 | 2/1992 | Japan | H01L 21/68 |
| 4-75799 | 3/1992 | Japan | B30B 11/00 |
| 4-296040 | 10/1992 | Japan | H01L 21/68 |
| 4-296485 | 10/1992 | Japan | H05B 3/20 |
| 4-298062 | 10/1992 | Japan | H01L 21/68 |
| 4-300136 | 10/1992 | Japan | B23Q 3/15 |
| 4-304941 | 10/1992 | Japan | B23Q 3/15 |
| 5-13557 | 1/1993 | Japan | H01L 21/68 |
| 5-21585 | 1/1993 | Japan | H01L 21/68 |
| 5-200641 | 8/1993 | Japan | B23Q 3/15 |
| 6-279974 | 10/1994 | Japan | C23C 4/10 |
| 6-291049 | 10/1994 | Japan | H01L 21/205 |
| 7-74451 | 8/1995 | Japan | C23C 16/44 |
| 2 263 430 | 11/1994 | United Kingdom | B23K 20/00 |
| WO 95/14308 | 5/1995 | WIPO | H01L 21/205 |

OTHER PUBLICATIONS

"Ceramic Wafer Heaters," *NGK Insulators, Ltd.*, Nagoya 487, Japan.

*Primary Examiner*—Cathy F. Lam
*Attorney, Agent, or Firm*—Fish & Richardson, P.C.

[57] ABSTRACT

A ceramic susceptor with an embedded metal electrode. The metal electrode has multiple apertures, and the ceramic material is cross-linked through the apertures. An electrical connection to the electrode protects the electrode from the environment in the processing chamber. The ceramic may be aluminum nitride, and the metal electrode may be a mesh of molybdenum wires. To form the electrical connection, the susceptor may be heated until an eutectic forms between a conductive connector and the metal electrode. Alternately, a brazing material may be placed between the metal layer and a conductive connector.

22 Claims, 9 Drawing Sheets

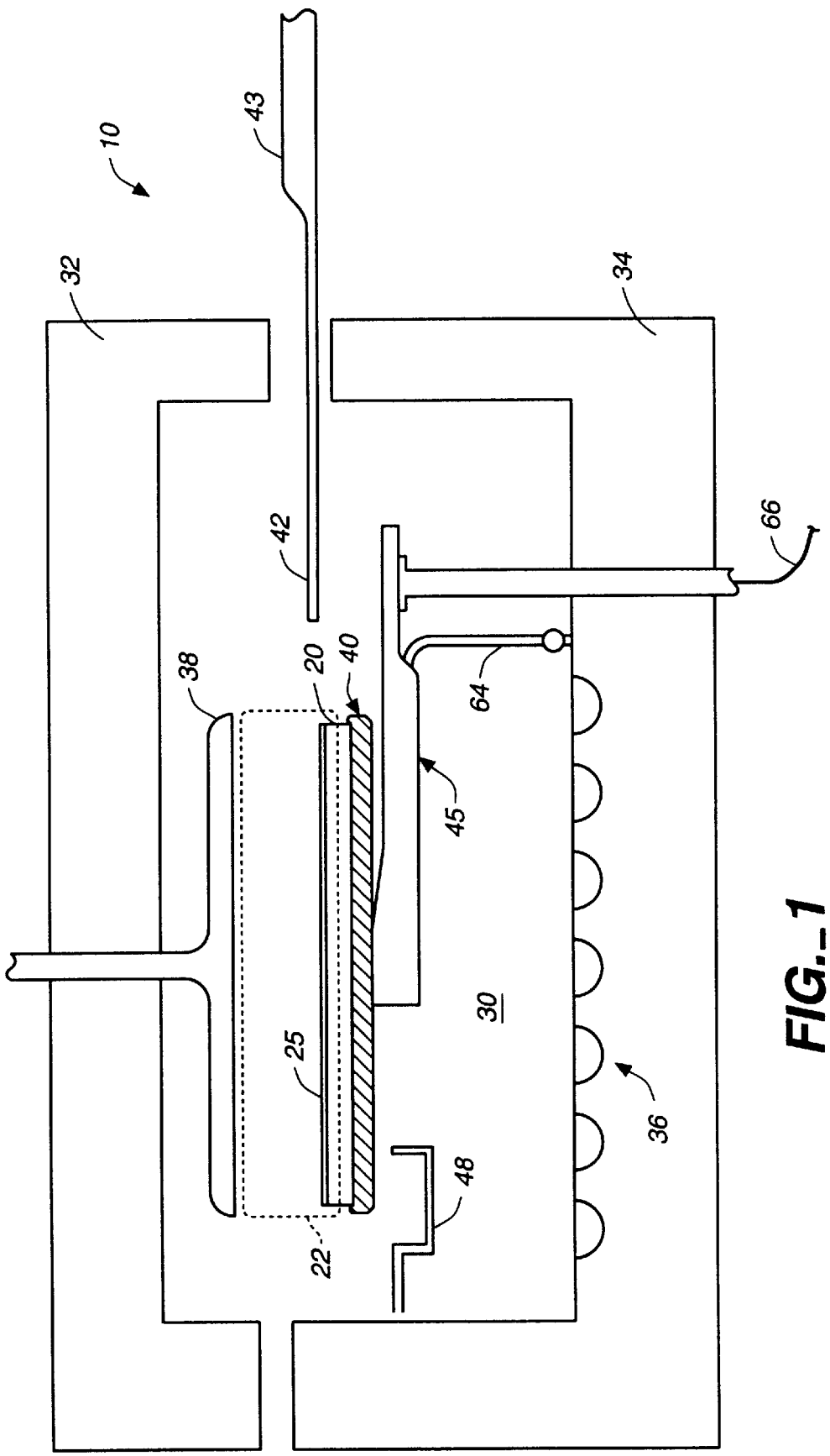
FIG._1

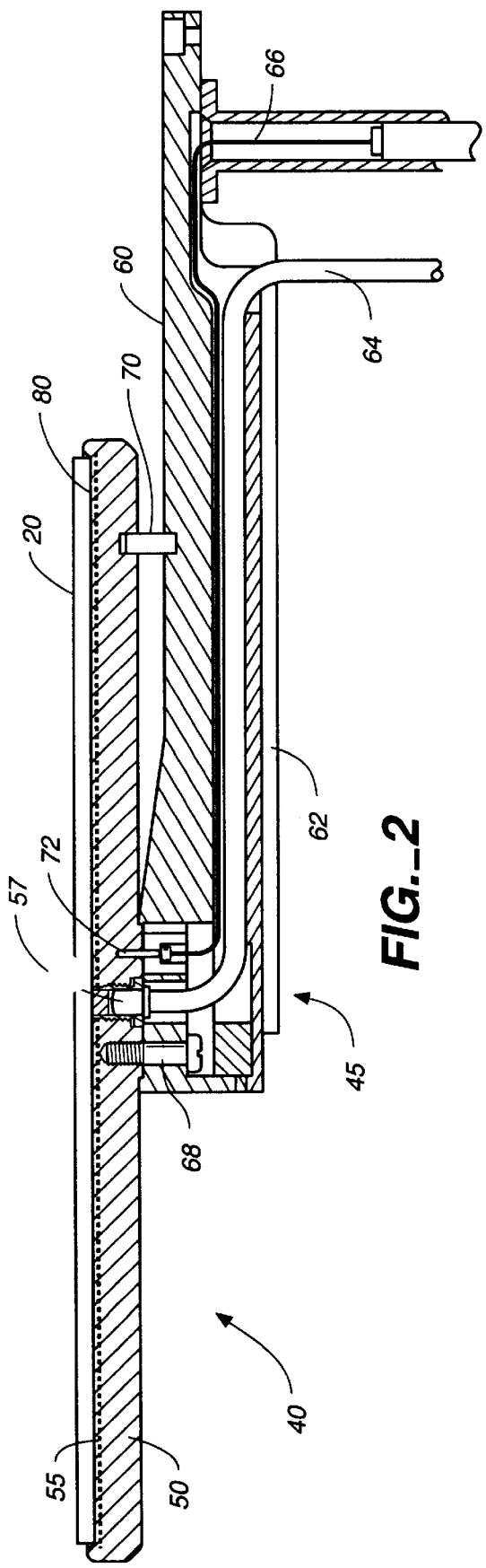
*FIG._2*
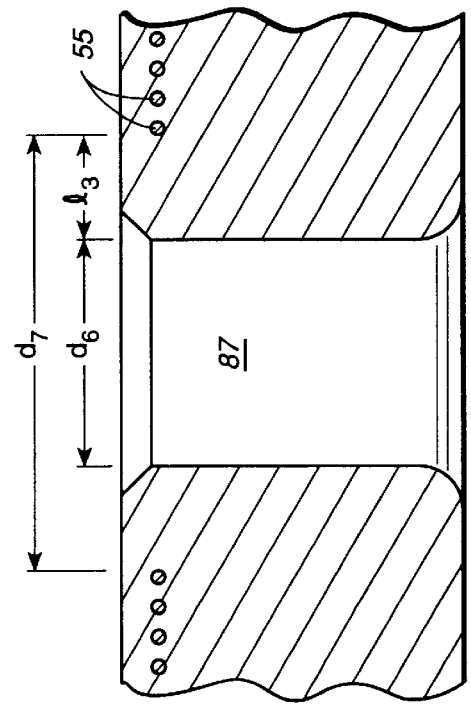
*FIG._8*
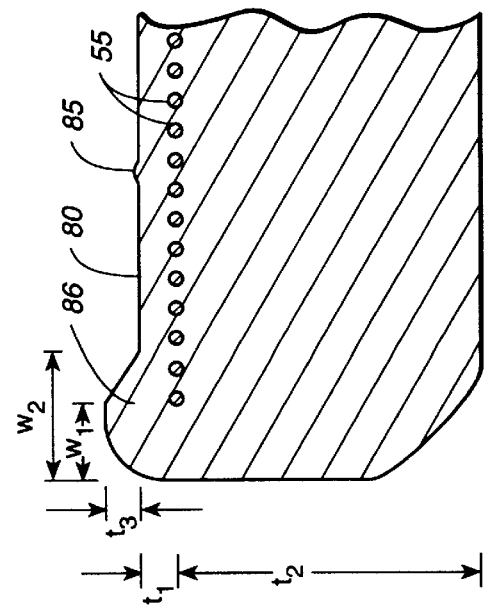
*FIG._7*

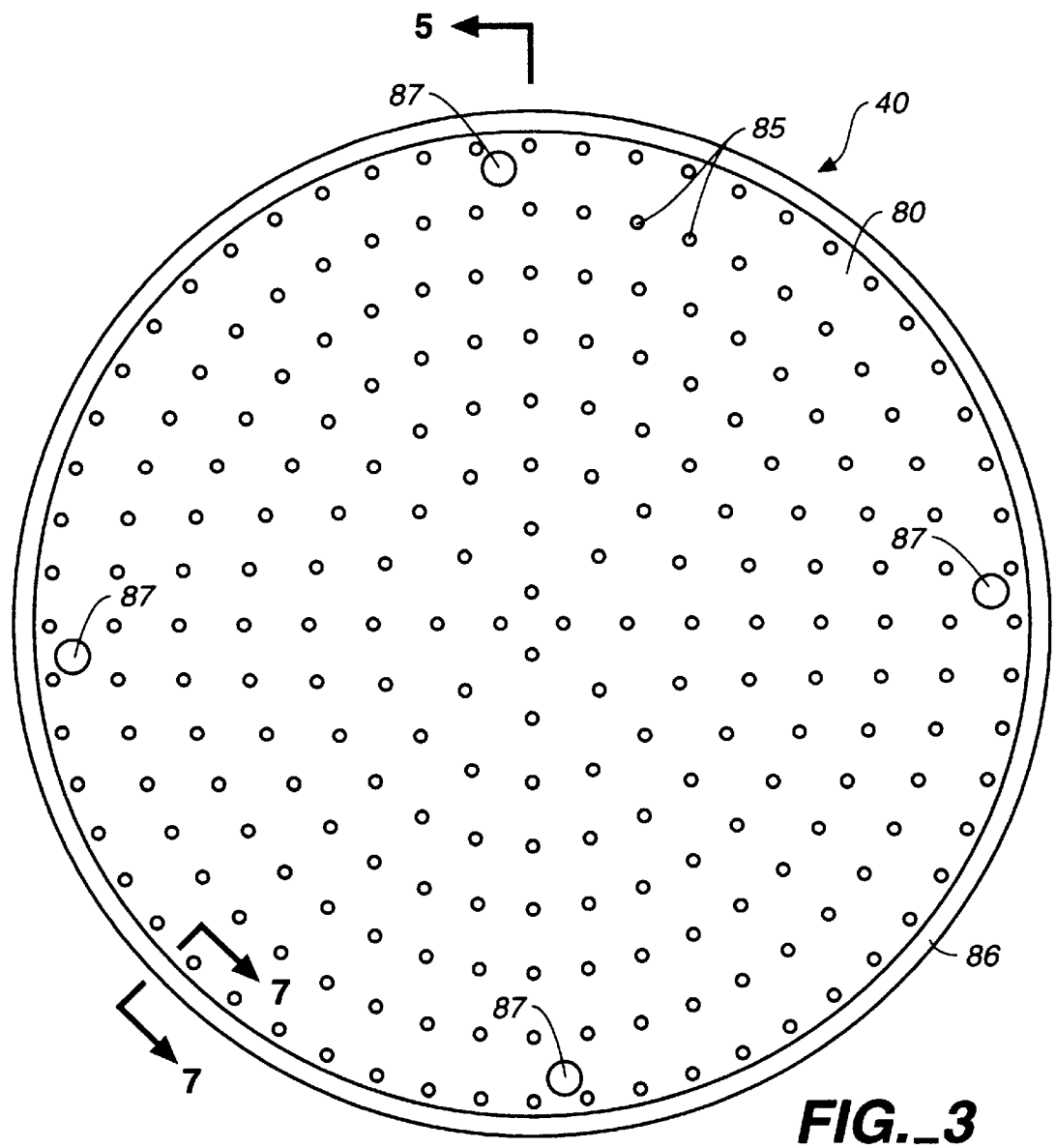
FIG._3
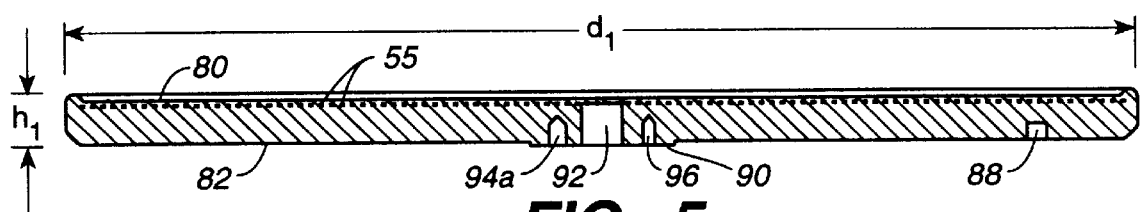
FIG._5

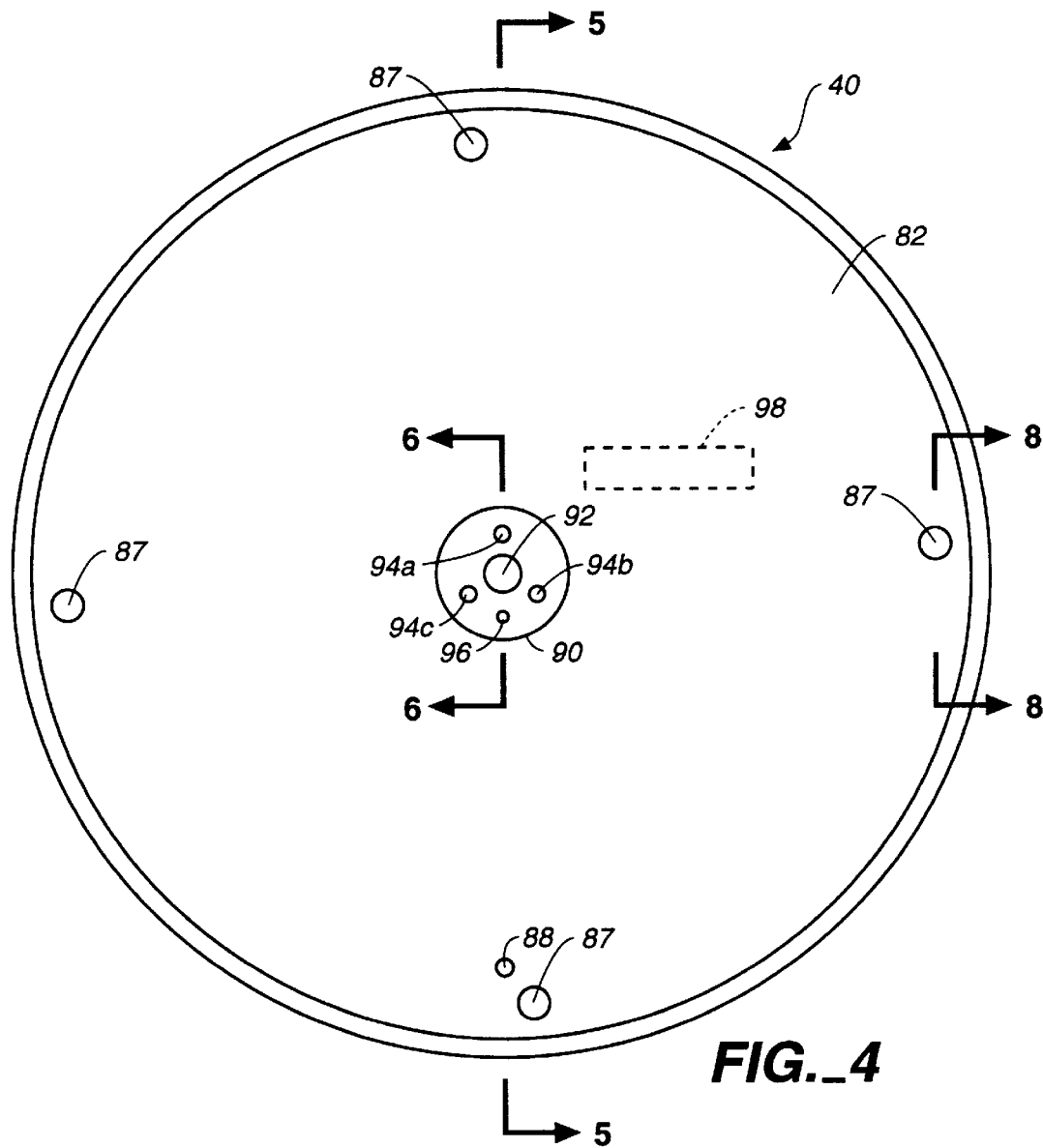
FIG._4
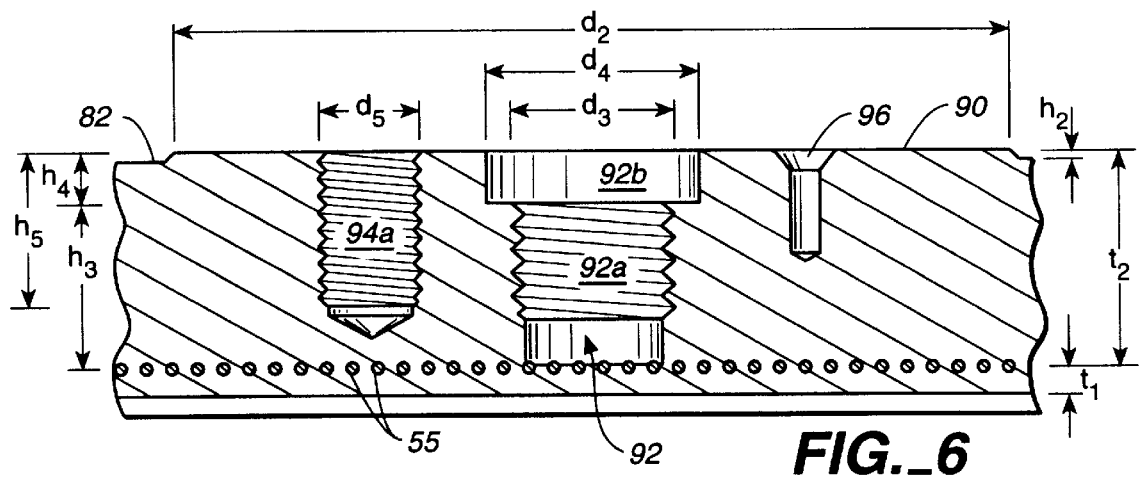
FIG._6

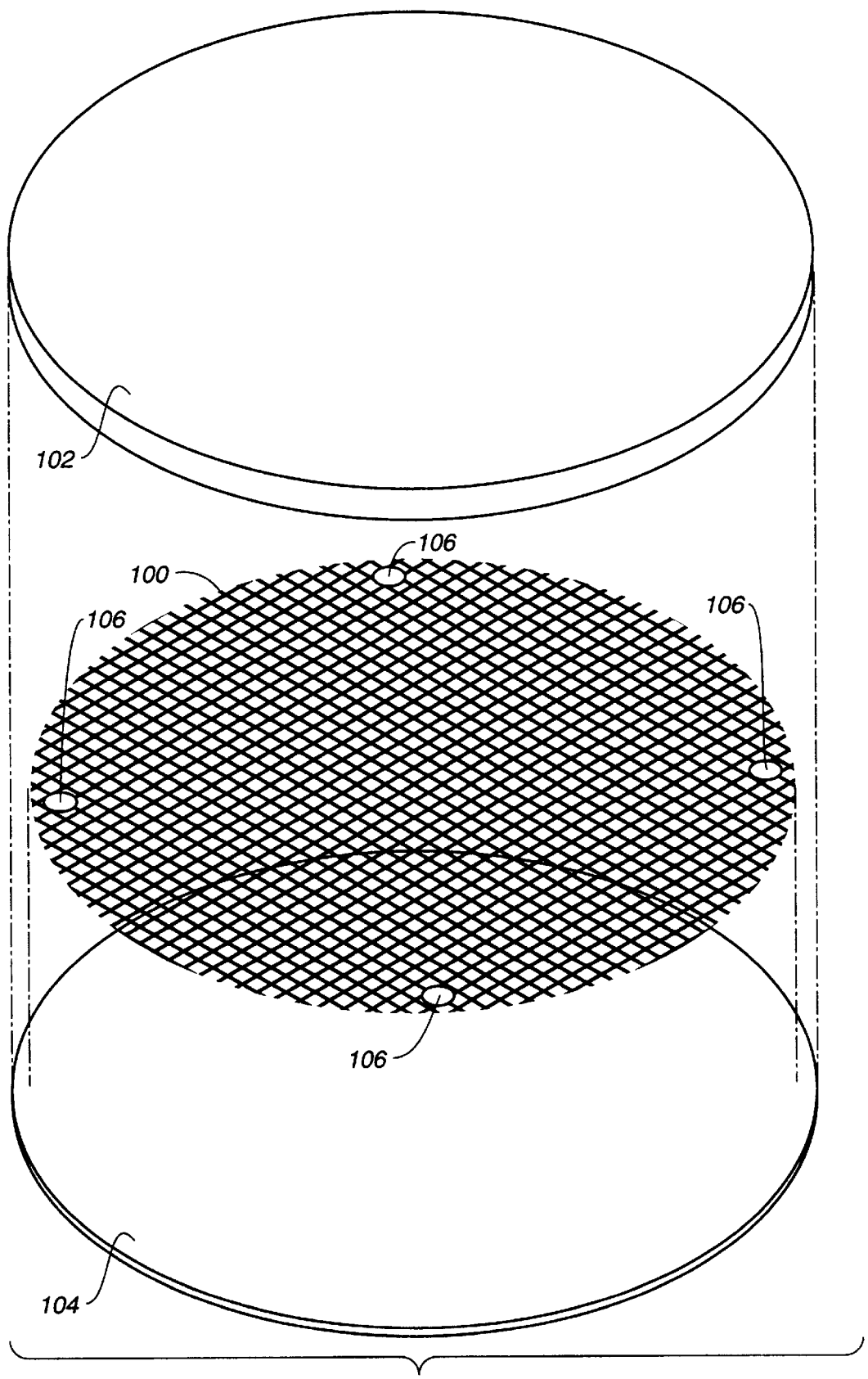
FIG._9

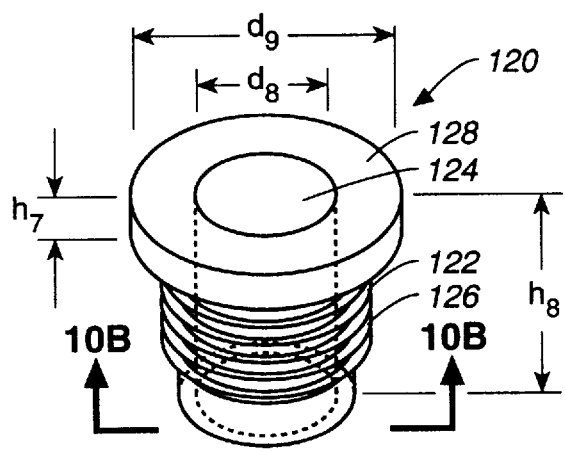
FIG._10A
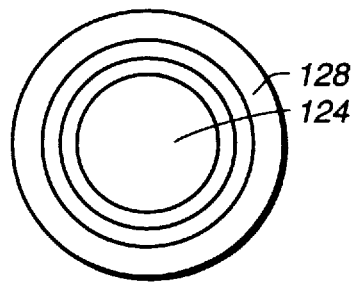
FIG._10B
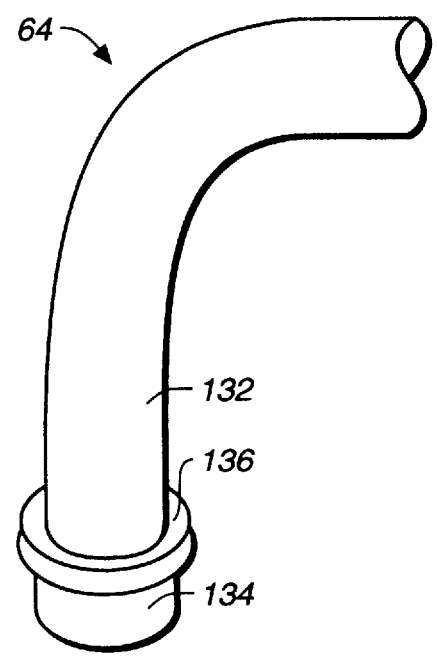
FIG._11
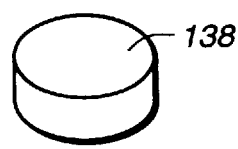
FIG._12

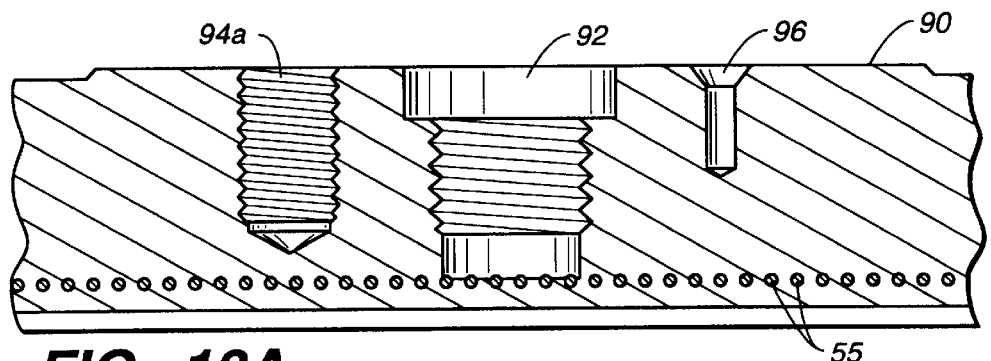
FIG._13A
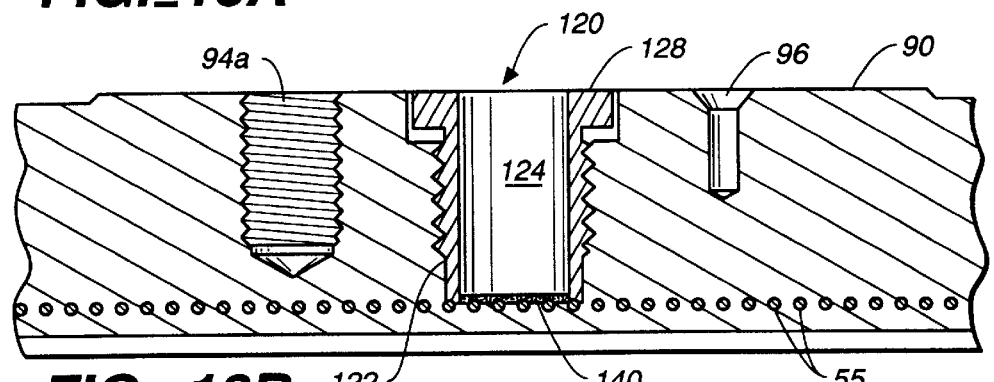
FIG._13B
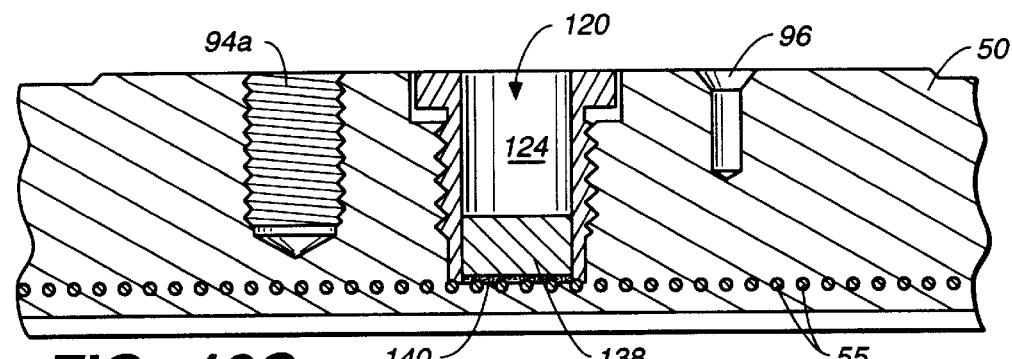
FIG._13C
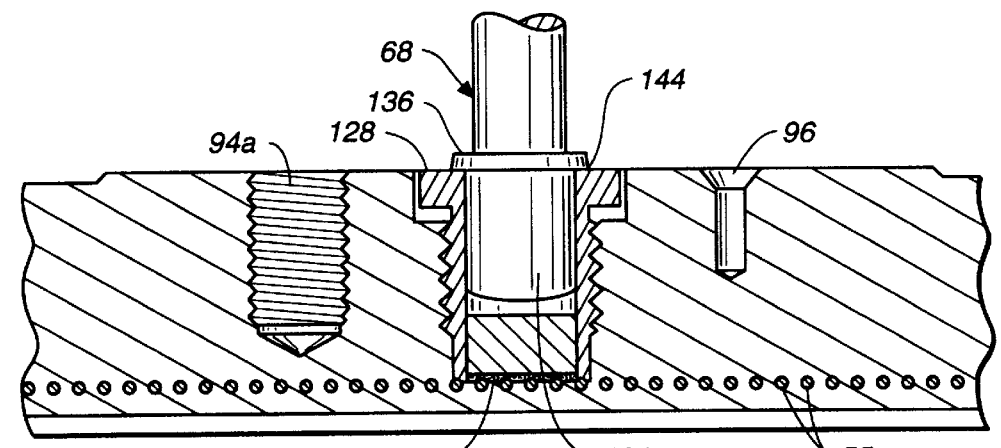
FIG._13D

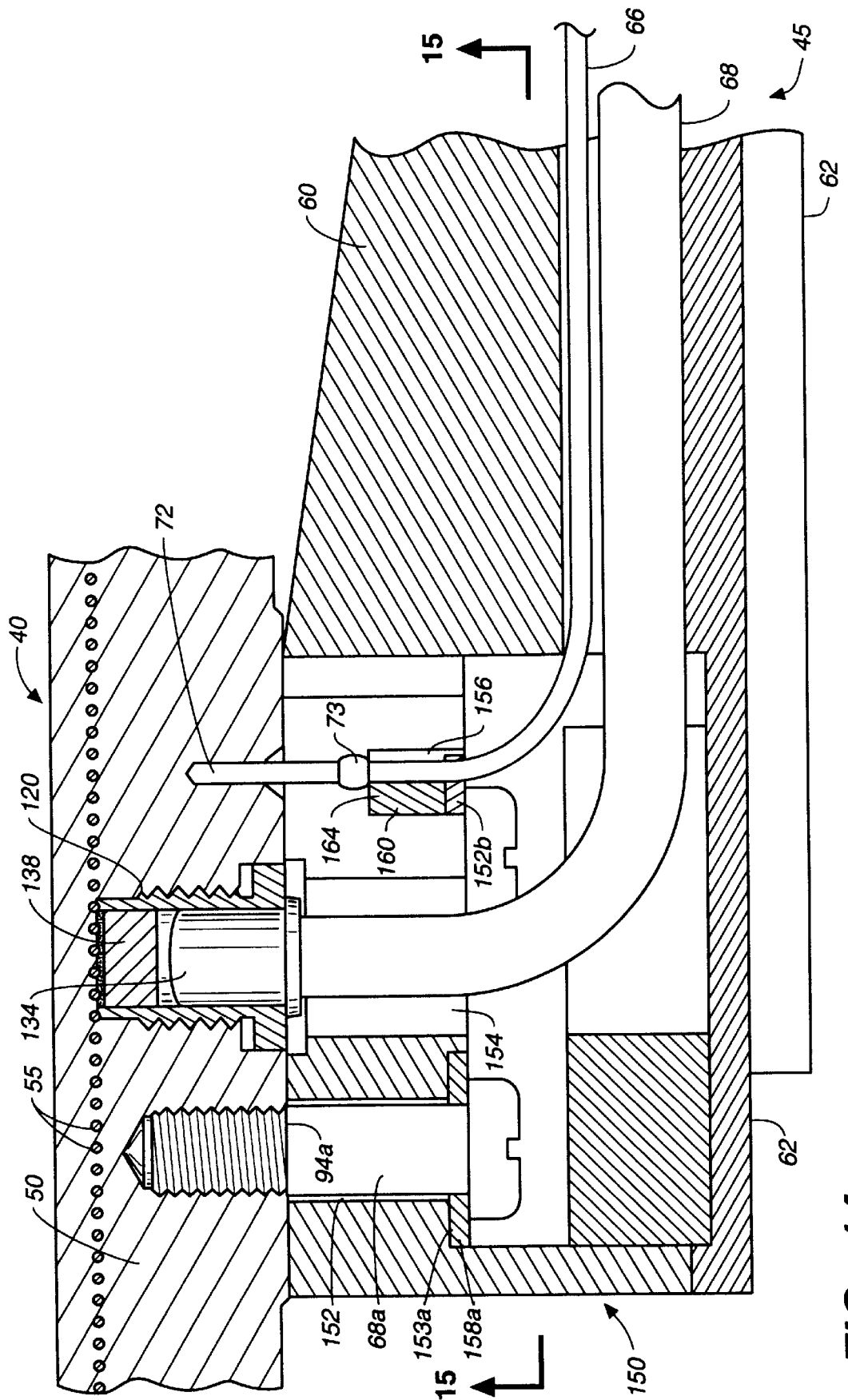
FIG._14

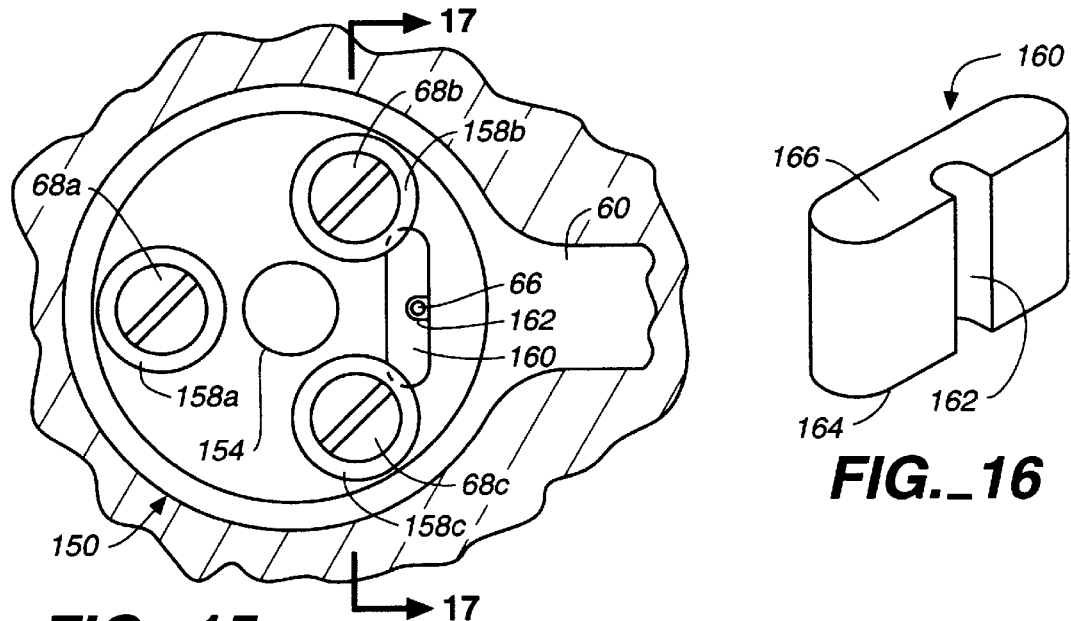
FIG._15
FIG._16
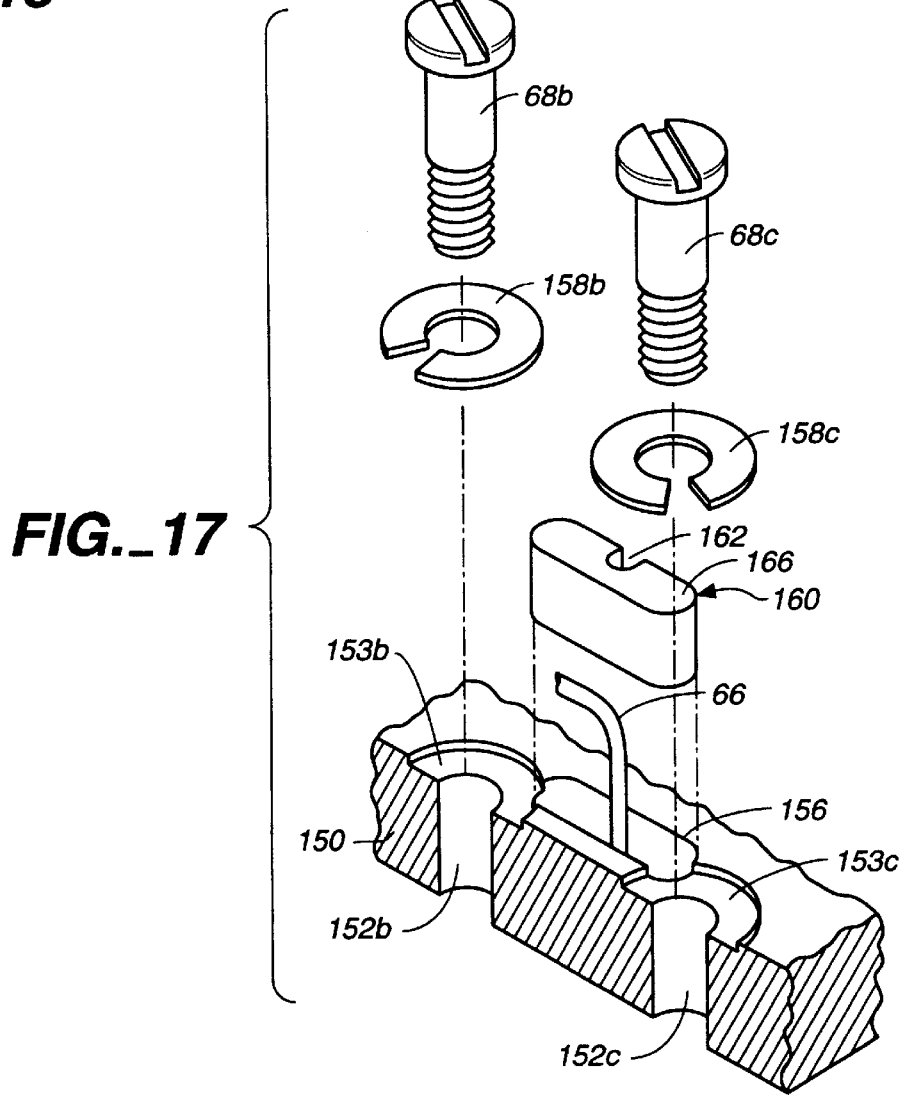
FIG._17

CERAMIC SUSCEPTOR WITH EMBEDDED METAL ELECTRODE AND BRAZING MATERIAL CONNECTION

This is a continuation of Ser. No. 08/503,910 filed Jul. 14, 1995, which has been abandoned.

BACKGROUND OF THE INVENTION

The present invention is directed to a ceramic susceptor with an embedded metal electrode for use in a deposition system. More particularly, the invention is directed to an aluminum nitride susceptor with an embedded molybdenum mesh electrode.

Chemical vapor deposition is a process to deposit a thin film layer onto a substrate such as a silicon wafer. In general, the substrate is supported in a deposition chamber which is held at a near vacuum, and the chamber and substrate are heated to a high temperature, e.g., 400° to 600° C. Deposition gasses are injected into the chamber, and a chemical reaction occurs to deposit the thin film layer onto the substrate. The thin film layer may be a dielectric material (such as silicon nitride or silicon oxide) or a metal (such as tungsten), and the deposition may be plasma-enhanced or thermally enhanced. For example, for a dielectric chemical vapor deposition, to deposit a silicon nitride thin film, silane ($SiH_4$), ammonia ($NH_3$), and nitrogen ($N_2$) gasses are introduced into the chamber, whereas to deposit a silicon oxide thin film, silane, oxygen ($O_2$), and nitrous oxide ($N_2O$) gasses are introduced into the chamber. To deposit a tungsten thin film in metal chemical vapor deposition, tungsten hexaflouride ($WF_6$) and hydrogen ($H_2$) are introduced into the chamber. In a plasma-enhanced chemical vapor deposition process, the gasses are subjected to intense radio frequency (rf) electric fields, and a plasma envelopes the substrate to increase the rate of deposition of the thin film layer.

During the deposition process, other parts in the chamber, in addition to the substrate, may be coated by the thin film layer. The continued accumulation of such thin film materials on these parts may degrade the performance of the deposition chamber. Therefore, the chamber must be cleaned periodically. Typically, the chamber is cleaned after each processing run, i.e., each time the substrate is removed from the chamber. Alternately, the chamber is cleaned after two, three, or four processing runs.

Cleaning is conducted by injecting gasses containing highly reactive elements, particularly fluorine, into the chamber, and the chamber is maintained at a high temperature, e.g. 400° C. to 600° C. Cleaning gasses that may be used include carbon tetraflouride ($CF_4$), nitrogen triflouride ($NF_3$), and dicarbon hexaflouride ($C_2F_6$). Oxygen or nitrous oxide may also be introduced into the chamber to prevent the formation of fluorocarbon polymers such as teflon which would otherwise degrade the clean process. The fluorine reacts with any thin film material that has been deposited on the mechanical parts in the chamber and strips off this material. During the cleaning process, the combination of the high temperature and reactive gasses create an extremely hostile environment inside the deposition chamber. Mechanical parts in the deposition chamber, are subject to corrosion and thermal stress fractures.

A susceptor (sometimes called a chuck) is a mechanical part that holds the substrate in the deposition chamber. In addition, the susceptor may act as an electrode, such as a DC or rf electrode. Conventional susceptors may be formed of aluminum with an anodized surface layer. Unfortunately, these anodized aluminum susceptors react with the fluorine gas and the anodized layer flakes off. As the anodized layer flakes off, the properties of the deposited film, such as stress, uniformity, and particle count, drift until out of specification. The susceptor must then be replaced. The typical lifetime of an anodized aluminum susceptor is two to four thousand processing runs, so the anodized aluminum susceptor needs to be replaced every one or two months.

In view of the foregoing, there is an unfulfilled desire for a susceptor with an embedded electrode which is highly resistant to the environment in a deposition chamber.

SUMMARY OF THE INVENTION

The present invention is directed to a susceptor for supporting a substrate during a deposition process. The susceptor includes a ceramic member and a high melting point conductive metal layer having a plurality of apertures therein embedded in the ceramic. There is an electrical connector for establishing electrical contact with the metal layer.

The ceramic member may be formed substantially of aluminum nitride, and the metal layer may be a wire mesh formed substantially of molybdenum. The wire mesh may have ten to sixty strands per inch.

The present invention is also directed to a method of forming a susceptor. A high melting point conductive metal layer having a plurality of apertures therein is isostatically pressed between two green ceramic plates until cross-linking between the two ceramic plates occurs through the apertures. Then an access is provided to the metal layer for an electrical connection thereto.

The access may be in the form of a cylindrical opening from a surface of the ceramic member to the metal layer. A threaded cylindrical conductive connector with a passageway therethrough may be secured in the opening. A brazing material may be placed between the metal layer and the conductive connector and the susceptor may be heated to braze the brazing material. A ceramic plug may be inserted into the passageway to push the brazing material between any space between the conductive connector and the ceramic member. Alternately, the susceptor may be heated until an eutectic forms between the conductive connector and the metal layer. A conductive cable may be inserted into the passageway and laser-welded to the conductive connector to protect the metal layer from the environment in the chamber.

The advantages of the invention include a susceptor with an embedded electrode which is highly resistant to the environment in a deposition chamber. The susceptor may have a lifetime many times greater than an anodized aluminum susceptor. The electrical connection may protect the embedded electrode from the deposition chamber environment.

Additional advantages of the invention will be set forth in the description which follows, and in part will be obvious from the description, or may be learned by practice of the invention. The objects and advantages of the invention may be realized by means of the instrumentalities and combinations particularly pointed out in the claims.

BRIEF DESCRIPTION OF THE DRAWINGS

The accompanying drawings, which are incorporated in and constitute a part of the specification, schematically illustrate a preferred embodiment of the invention, and together with the general description given above and the detailed description of the preferred embodiment given below, serve to explain the principles of the invention.

FIG. 1 is a schematic diagram of a deposition system.

FIG. 2 is a schematic cross-sectional side view of an arm assembly supporting a susceptor in accordance with the present invention.

FIG. 3 is a schematic top view of a susceptor of the present invention.

FIG. 4 is a schematic bottom view of a susceptor of the present invention.

FIG. 5 is a schematic cross-sectional view along line 5—5 of FIG. 4.

FIG. 6 is a schematic enlarged cross-sectional view of the center of a susceptor of the present invention along line 6—6 of FIG. 4.

FIG. 7 is a schematic enlarged cross-sectional view of the edge of a susceptor of the present invention along line 7—7 of FIG. 3.

FIG. 8 is a schematic enlarged cross-sectional view of a lift-pin hole along line 8—8 of FIG. 4.

FIG. 9 is a schematic illustration of sandwiching a molybdenum mesh between two aluminum nitride plates to form a susceptor according to a process of the present invention.

FIG. 10A is a schematic perspective view of a connector for electrically connecting an embedded electrode to a cable.

FIG. 10B is a view along line 10B—10B of FIG. 10A.

FIG. 11 is a schematic perspective view of a portion of a cable for electrically connecting an embedded electrode to a power supply.

FIG. 12 is a schematic perspective view of a plug for use with the electrical connector of FIG. 10A.

FIGS. 13A–13D are schematic cross-sectional side views of a portion of a susceptor of the present invention illustrating a process for assembling an electrical connection to the embedded electrode.

FIG. 14 is a schematic cross-sectional view of the electrical and mechanical connections between the susceptor and its support arm according to the present invention.

FIG. 15 is a bottom view of the mechanical connection between the susceptor and its support arm along line 15—15 of FIG. 14.

FIG. 16 is a schematic perspective view of a ceramic keeper for holding a thermocouple.

FIG. 17 is an schematic, exploded, cross-sectional view generally along line 17—17 of FIG. 15.

DESCRIPTION OF THE PREFERRED EMBODIMENTS

As shown in FIG. 1, a deposition system 10 includes a susceptor 40 which supports a substrate 20 in a vacuum sealed chamber 30. An upper casing 32 and a lower casing 34, formed of a conductive metal such as aluminum, enclose chamber 30. A heater or heating element 36, such as an array of lamps, is located in lower casing 34. A perforated gas distribution plate 38 (sometimes called a "shower head") is suspended from upper casing 32 about one inch above substrate 20. An arm 45 can raise or lower susceptor 40 in chamber 30.

Substrate 20 may be a semiconductor wafer, such as silicon or gallium arsenide; a glass plate; a plastic workpiece; or any other such object to be processed in the chamber. The processing may be any type of chemical vapor deposition, whether plasma-enhanced or not, thermally enchanced or not, including dielectric deposition (e.g., silicon oxide or silicon nitride) and metal deposition (e.g. tungsten). Generally, the invention applies to any deposition process utilizing a susceptor which will be cleaned by fluorine. The description herein assumes that the substrate is a silicon wafer approximately six to eight inches in diameter which will be subject to plasma-enhanced dielectric chemical vapor deposition.

Susceptor 40 (sometimes called a chuck) performs three functions. First, susceptor 40 supports substrate 20 in the center of chamber 30, for example, by gravity. Second, for a plasma-enhanced chemical vapor deposition process susceptor 40 acts as an electrode, such as a negative rf electrode. For other chemical vapor deposition processes, the susceptor might act as a different type of electrode. Third, susceptor 40 transfers energy from heating element 36 to substrate 20 to uniformly heat the substrate.

In a deposition process to coat substrate 20, lamps 36 heat chamber 30 to a temperature of about 400° C. to 600° C. At this step, the parts in the chamber are subject to thermal shock. Vacuum pumps (not shown) maintain chamber 30 at a pressure of about five to ten milliTorr. Any connections between chamber 30 and the external environment (such as the connection of the susceptor to a power supply) are protected by vacuum seals (not shown). Susceptor 40 is driven as a negative rf electrode, and either gas distribution plate 38 or upper casing 32 is driven as a positive rf electrode to apply an electromagnetic field across the substrate 20. Deposition gasses, such as silane and nitrogen, are injected into chamber 30 through thousands of tiny holes in gas distribution plate 38. A plasma is formed in region 22, and a chemical reaction occurs inside the chamber to deposit a thin film layer 25, such as silicon nitride, onto substrate 20.

A blade 42 attached to a robot arm 43 carries substrate 20 into and out of chamber 30. Four lift pins 48 (only one pin is shown in FIG. 1) fit through lift pin holes in susceptor 40. Blade 42 carries substrate 20 above the susceptor 40, the lift pins project up through the lift pin holes to lift wafer 20 off of blade 42, blade 42 retracts, and the lift pins lower the substrate 20 into position on susceptor 40. Substrate 40 is removed from chamber 30 by the reverse process, beginning with the lift pins raising substrate 20 off of susceptor 40.

After substrate 20 is removed, susceptor 40 is cleaned in situ (in the chamber). Chamber 30 is maintained at the same temperature, i.e. 400° C. to 600° C. Gasses containing reactive fluorine, such as carbon tetrafluoride ($CF_4$), nitrogen trifluoride ($NF_3$), and dicarbon hexafluoride ($C_2F_6$), are released into chamber 30 from gas distribution plate 38. An oxygen containing gas is also introduced into the chamber to prevent the formation of fluorocarbon polymers. The fluorine scours susceptor 20 and removes any accumulated thin film material.

The susceptor 40 and arm 45 are shown in more detail in FIG. 2. Susceptor 40 is a ceramic member 50 with an embedded conductive metallic layer 55 which serves as the negative rf electrode. The conductive metallic layer 55 has a large number of apertures, and the ceramic is densified (i.e., there is cross-linking between the molecules) in the apertures so that the ceramic material on both sides of metallic layer 55 is connected to form a sturdy susceptor. Also, the metallic layer 55 is completely encapsulated by member 50 so that the external environment cannot reach the electrode. Ceramic member 50 is preferably aluminum nitride, approximately 99.5% pure. Metallic layer 55 is preferably a high melting-point metal (e.g., above 1700° C.), such as molybdenum, tantalum, platinum, or tungsten, or a combination thereof. In the preferred embodiment described herein, the metallic layer is a molybdenum mesh (see also FIG. 9).

A susceptor constructed according to the present invention is nearly impervious to the environment in deposition chamber 30. Aluminum nitride reacts with fluorine at the surface of the susceptor to form a very thin aluminum fluoride layer. The solid aluminum fluoride at the surface of the susceptor acts as a barrier and prevents further reaction of the aluminum nitride with the fluorine. Consequently, susceptor 40 may have a lifetime of ten to fifty-thousand wafer runs, typically thirty-thousand wafer runs. The cost of susceptor 40 may be approximately twice that of an anodized aluminum susceptor. Because susceptor 40 has a longer lifetime, there is less down-time of the processing chamber. In addition, thin film quality is more consistent because susceptor 40 degrades much more slowly.

Arm 45 includes a top portion 60 and a bottom portion 62. Bottom portion 62 may be a removable cover. A conductive cable 64 runs between top portion 60 and bottom portion 62. Metallic layer 55 is electrically connected to cable 64 by an electrical connection 57. Cable 64 may be hooked to a power supply (not shown) outside chamber 30 so that metallic layer 55 may be driven as the negative rf electrode. Top portion 60 of arm 45 is connected at the center of susceptor 40 by three shouldered screws 68a, 68b, 68c (see also FIGS. 14 and 15). A ceramic bearing 70 is located between susceptor 40 and top portion 60 of arm 45 to hold susceptor 40 stable. A thermocouple 72 is inserted into ceramic member 50 to measure the temperature of susceptor 40. Wiring 66 connecting thermocouple 72 to a sensor (not shown) outside chamber 30 runs between top portion 60 and bottom portion 62.

FIGS. 3–7 show an embodiment of susceptor 40 in which the susceptor is constructed to support a silicon wafer about eight inches in diameter. Common wafer sizes are four, five, six, and eight inch diameters. Twelve inch diameter wafers may be expected in the near future. Naturally, it will be appreciated that susceptor 40 could be made larger or smaller to accommodate larger or smaller wafers, or other substrates to be processed. Thus, the specific dimensions recited below are merely exemplary. These dimensions are intended to aid in the description of the relative size, position, and tolerance of the various parts in a preferred embodiment, and, of course, other dimensions are within the spirit and scope of the present invention.

As shown in FIGS. 3 and 5, susceptor 40 may be a flat plate with a diameter $d_1$ of 8.2 inches and a thickness $h_1$ of 0.38 inches. The top surface 80 of the plate has dimples 85. Each dimple 85 projects out from the top surface 80 by about ten microns. Dimples 85 may form a radial pattern of eight concentric rings covering the entire top surface 80, with a spacing between adjacent rings of 1.02 inches.

The substrate 20 rests on dimples 85 of top surface 80. Dimples 85 reduce the surface area of top surface 80 that is in contact with substrate 20 by about 96.5%. By reducing the contact surface area, the residual charge that accumulates during the application of rf power to the substrate, which creates an electrostatic force between substrate 20 and susceptor 40, decreases or at least dissipates more quickly. This prevents substrate 20 from sticking or tilting when raised by lift pins 48.

As shown in FIGS. 4 and 5, a bottom surface 82 of susceptor 40 is generally smooth. Four lift-pin holes 87 pass through ceramic member 50 from top surface 80 to bottom surface 82. Each lift pin hole 87 may be 0.28 inches in diameter, and is positioned slightly off-axis from arm 45 so that lift-pins 48 will have room to fit. An ellipsoid indentation 88 may be present in bottom surface 82 to engage bearing 70 to maintain susceptor 40 stable. A part number or other information may be engraved or abrasively blasted in indicia area 98.

As shown in FIGS. 4 and 6, bottom surface 82 may have a raised area 90 which with a diameter $d_2$ of 1.3 inches and a height $h_2$ of ten mils. Arm 45 will mate to susceptor 40 at raised area 90. A channel or opening 92 runs from bottom surface 82 to electrode 55 for receiving electrical connector 57. The channel 92 has a narrow section 92a with a diameter $d_3$ of 0.187 inches and a depth $h_3$ of 0.32 inches. Section 92a may be threaded. Channel 92 also has a wider section 92b that which has a diameter $d_4$ of 0.35 inches and a depth $h_4$ of 0.06 inches.

Three screw holes 94a, 94b, and 94c, each with a diameter $d_5$ of about 0.16 inches and a depth $h_5$ of between 0.25 and 0.31 inches, will receive three shouldered screws 68a, 68b, and 68c (see also FIGS. 14 and 15). A hole 96 will receive the thermocouple 72.

As shown in FIG. 6, electrode 55 may be a more or less planar sheet embedded in ceramic member 50. The distance $t_1$ from top surface 80 to electrode 55 is about forty mils (thousandths of an inch), and the distance $t_2$ from electrode 55 to bottom top surface 80 is about 0.34 inches. Electrode 55 may be a mesh of high melting point metal wires, such as molybdenum, tungsten, platinum, or tantalum. In a preferred embodiment, electrode 55 is a molybdenum mesh. It appears that at the deposition processing conditions of interest, the presence of a metal mesh, rather than a solid metal sheet, does not affect the uniformity of the electrical field through substrate 20.

The material of ceramic member 50 needs to be resistant to both corrosion and thermal shock. The preferred ceramic material is aluminum nitride. Silicon carbide is another possible ceramic material.

The metal electrode must have a melting point greater than the temperature reached in chamber 30 (e.g., 700° C.), and in particular a melting point higher than the temperatures reached during fabrication of the susceptor 40, i.e., the sintering temperature of the ceramic material (e.g., 1750° C. for aluminum nitride). Relatively pure molybdenum is far preferred for electrode 55. Molybdenum works well as electrode 55 because it has a high melting point (4400° C.). Molybdenum also has a coefficient of thermal expansion that is closer to aluminum nitride than other high melting-point metals, so that susceptor 40 is subject to less stress from the heating and cooling cycles of the deposition process. Furthermore, molybdenum is sufficiently conductive to act as an electrode.

In the preferred embodiment, the individual wires in the mesh that constitutes electrode 55 are each five to six mils thick, so that the mesh is about ten to twelve mils thick. The mesh may have ten to seventy strands per inch, and more preferably twenty to sixty strands per inch. Fifty strands per inch is the most preferred embodiment. During fabrication of susceptor 40, the aluminum nitride is sintered until it densifies in the gaps in mesh 55. If the distance between the strands in the mesh size is too small, then there may be an insufficient amount of cross-linking, and the susceptor will be fragile. On the other hand, if the distance between the strands is too large, then the concentrated electric field near the strands will create a non-uniform electrical field across the substrate during the deposition process, and thin film deposition uniformity may be affected.

An edge of susceptor 40 is shown in FIG. 7. As can be seen, top surface 80 has a lip 86 along the outer perimeter of susceptor 40. Lip 86 may be about 0.03 inches high (thickness $t_3$) and 0.3 inches wide (width $w_1$). Lip 86 prevents substrate 20 from sliding off top surface 80. The mesh that forms electrode 55 may extend to within about 0.15 inches (width $w_2$) of the outer edge of susceptor 40.

A lift-pin hole 87 with a diameter $d_6$ of 0.32 inches is shown in FIG. 8. The mesh that forms electrode 55 has a hole with a diameter $d_7$ of about 0.55 inches surrounding lift-pin hole 87 so that electrode 55 extends to within about 0.14 inches (length $l_1$) of hole 87. The edges of hole 87 are rounded.

As shown in FIG. 9, susceptor 40 may be formed by placing a molybdenum screen or mesh 100 in a sandwich between two "green", i.e., incompletely sintered, aluminum nitride plates 102 and 104, and heating and pressing the sandwich. Specifically, the molybdenum mesh 100 may be cut into a 8.05 inch diameter circle, and four circular sections 106 are cut out of mesh 100. The circular sections 106 will match the locations of lift-pin holes 87 (see FIG. 8).

Plates 102 and 104 are formed of aluminum nitride powder that has been isostatically pressed (but not heated) into a "green" state in which the aluminum nitride powder is held together like a pressed snowball. One plate, e.g., plate 102, is thicker than the other plate. The outer surface of thick plate 102 will provide bottom surface 82 of the susceptor, and the outer surface of thin plate 104 will provide top surface 80 of the susceptor. Layer 104 should be thin so that the dielectric layer between substrate 20 and electrode 55 is small and more power reaches the substrate. However, if layer 104 is too thin it will be extremely fragile and difficult to manufacture. Accordingly, layer 104 is preferably between thirty and sixty mils thick, and more preferably it is 40 mils thick (see also FIG. 6). Layer 102 is thick enough to make susceptor 40 sturdy, e.g., the susceptor will not shatter if dropped on the floor. Also, layer 102 is bulky enough to contain a large amount of heat that can be quickly transferred to the substrate. Layer 102 should be at least 0.25 inches thick, more preferably at least 0.325 inches thick (see FIG. 6).

A small amount of aluminum nitride powder is sprinkled on the inner surfaces of plates 102 and 104 prior to pressing. Then the sandwich of molybdenum mesh 100 and aluminum nitride layers 102 and 104 is hot isostatically pressed at about 1700° C. for twelve hours in a inert or slightly reducing atmosphere such as a nitrogen, argon or helium atmosphere. As hot isostatic pressing is a well known process to those skilled in this art, further details of the processing need not be described. The baking of the sandwich sinters the two aluminum nitride plates 102 and 104 together and creates cross-linking through the gaps between the strands of the mesh. This creates an extremely sturdy ceramic susceptor with an embedded electrode. It should be noted that a solid sheet with enough punched or laser-cut holes for the two plates to effectively sinter together could also be used instead of a mesh.

Once the plates 102 and 104 have been sintered together, susceptor 40 may be molded into the proper shape. First, dimples 85 may be formed on top surface 80. This may be done by laying down a photomasking pattern on top surface 80, and then placing susceptor 40 in an automated sandblasting machine. The sandblasting particles bounce off the rubbery masking material, and erode the harder aluminum nitride material to form dimples 85. After the dimples 85 are formed on top surface 80, the lift-pin holes 87 may be formed by grinding a channel or passageway between top surface 80 to bottom surface 82 through the gaps 106 in mesh 100. The proper location for lift-pin holes 87 may be determined using an x-ray photograph to locate gaps 106. Once the lift-pin holes 87 are created, various openings and indentations in bottom surface 82 may be formed, for example, by sandblasting or grinding. The various openings and indentations include central channel 92 for the electrical connection, holes 94a, 94b, and 94c to receive shouldered screws, and indentation 96 for a thermocouple.

As noted, the environment in chamber 30 is extremely corrosive. The presence of fluorine at temperatures of 400° C. to 600° C. quickly erodes many materials. For example, molybdenum (and other high-melting point conductive metals) reacts with fluorine to form a gas. Consequently, continued exposure of electrode 55 to the environment in chamber 30 will eat away the electrode. Therefore, the present invention utilizes an electrical connection 57 between electrode 55 and cable 64 which protects electrode 55 from the environment in the chamber.

FIGS. 10A and 10B show an electrode connector 120 in the form of a threaded hollow eyelet, including a cylindrical tube 122 having a conduit 124 extending therethrough. The cylindrical tube 122 may be 0.32 inches high (height $h_8$) and conduit 124 may have a diameter $d_8$ of 0.187 inches. The exterior of tube 122 can be threaded with M7 threads 126. Connector 120 also has a annular flange 128, with an outer diameter $d_9$ of 0.35 inches and a height $h_9$ of 0.06 inches. Connector 120 is formed of a conductive metal which is resistant to the corrosive environment in chamber 30. For example, connector 120 may nickel, platinum, or Haines 242. In the preferred embodiment, connector 120 is nickel. The tube configuration, particularly the opening at the bottom of conduit 124, decreases the surface area contact between the connector material (e.g., nickel) and the electrode material (e.g. molybdenum), and thereby reduces the thermal stress caused by the different coefficients of thermal expansion. The tube configuration also allows for the insertion of cable 64 into conduit 124. Since rf power travels on the outside of a conductor, connector 120 does not need to be solid.

FIG. 11 shows an end portion of an electrical cable 64 which can be connected to connector 120 to supply power to electrode 55. Cable 64 may include a flexible wire 132, about 0.157 inches in diameter, which is long enough to reach the lead of an rf power supply located either inside or outside of chamber 30. Cable 64 ends in a rounded stopper 134. Stopper 134 is shaped to fit snugly into conduit 124. For instance, stopper 134 may have a diameter of about 0.185 inches. The edge of stopper 134 next to the wire 132 has a raised annular lip 136 with a diameter of about 0.21 inches. In the preferred embodiment, cable 64, including wire 132 and stopper 134, is the same material, i.e., nickel, as connector 120 so that the two parts have the same coefficient of thermal expansion and are easy to weld. However, cable 120 could be another conductive material which is resistant to the environment in chamber 30.

FIG. 12 shows a ceramic plug 138 which will be inserted into conduit 124 to form part of electrical connection 57. Plug 138 is preferably the same material, i.e., aluminum nitride, as the ceramic member 50. Plug 138 is disk-shaped, 0.35 inches in diameter, and at most about 0.09 inches high.

An electrical assembly 57 for connecting susceptor 40 to cable 64, and the process for forming that connection, are shown in FIGS. 13A–13D. As shown in FIG. 13A, and as discussed above, an opening 92 is formed in bottom surface 82 through ceramic member 50 to electrode 55. As shown, in the preferred embodiment opening 92 is pre-threaded to mate with threads 126 of connector 120. Then, as shown in FIG. 13B, threaded connection 120 can be screwed into opening 92 until the top of its flange 128 is flush with bottom surface 82. The bottom of tube 122 may contact electrode 55, or there may be a clearance of several mils. Threaded connector 120 provides additional shear strength to the electrical connection so that susceptor 40 can be picked up by an attached cable 64. Threaded connector 120 can also be screwed down tightly to form an electrical connection with electrode 55. In addition, the threads 126 of connector 120 create a tortuous path (but not an absolute barrier) between the environment in chamber 30 and electrode 55.

In the preferred embodiment, as shown in FIG. 13B, a brazing material is placed on electrode 55 at the bottom of conduit 124. The brazing material may be a compound containing aluminum, such an aluminum-silicon-magnesium compound. A preferred compound is one containing 88.68% aluminum, 10.06% silicon, and 1.19% magnesium (by weight). Then, as shown in FIG. 13C, ceramic plug 138 is inserted into conduit 124 above brazing material 140. Plug 138 is pressed down to force brazing material 140 into any spaces between the outer surface of connector 120 and ceramic member 50, and into any spaces between the inner surface of connector 120 and plug 138. This assembly is then brazed together by heating it to about 560°–580° C. Brazing material 140 bonds to both the mesh of electrode 55 and to connector 120 to form an electrical connection. Brazing material 140 is also resistant to fluorine and protects electrode 55 from the environment in chamber 30.

In another embodiment, an eutectic is used to make electrical connection 57. In this embodiment, no brazing material is used. Instead, connector 120 is screwed into opening 92 to be in contact with the metal of electrode 55. In this embodiment, connector 120 is nickel and electrode 55 is molybdenum. This assembly is heated to about 1550° C. At this temperature, the nickel and molybdenum begin to diffuse and form a eutectic, i.e., a graduated alloy, in the area near the junction between electrode 55 and connector 120. The eutectic is mostly nickel on the connector side of the junction, and mostly molybdenum on the electrode side of the junction. Nickel reacts with fluorine to form solid nickel fluoride (NiF). Therefore, when the fluorine environment of chamber 30 reaches the eutectic through the spaces between the outer surface of connector 120 and ceramic member 50, a solid NiF barrier forms. This solid NiF layer prevents fluorine from reacting with the materials beneath the NiF barrier layer, and thereby protects the electrode underneath. This embodiment need not use ceramic plug 138.

Finally, as shown in FIG. 13D, stopper 134 of cable 64 is inserted into conduit 124 until lip 136 is flush with the top of flange 128. Lip 136 of cable 64 and flange 128 of connector 120 are laser welded to form a hermetic weld 144 at the joint between the lip and the flange. Hermetic weld 144 retards the chamber environment from reaching electrode 55 by a path through conduit 124.

Once electrode 55 has been electrically connected to cable 64, susceptor 40 is attached to arm 45. Arm 45 may be made of a one-piece ceramic, such as aluminum oxide. As shown in FIGS. 14 and 15, top portion 60 of the arm ends in a base 150 with five bores that match the five holes in raised area 90 in bottom surface 82. There are three bores 152a, 152b, and 152c for screws 68a, 68b, and 68c; a central bore 154 for cable 64; and a bore 156 for thermocouple 72. To connect arm 45 to susceptor 40, the loose end of cable 64 is strung through central bore 154, and base 150 is pushed up against area 90. Then arm 45 is rotated so that bores 152 match screw holes 94a, 94b, and 94c in the bottom surface of susceptor 40 (see FIG. 4). Slotted conical spring washers 158a, 158b, 158c are placed in indents 153a, 153b, 153c in base 150, and shouldered screws 68a, 68b, 68c are inserted through the holes in the washers and bores 152. Shouldered screws 68a, 68b, 68c are then screwed into holes 94a, 94b, 94c to firmly attach arm 45 to susceptor 40. This assembly can withstand the severe temperature cycling in chamber 30, and can be assembled with regular wrenches rather than torque wrenches.

Returning to FIG. 14, a removable thermocouple is provided to sense the temperature of ceramic member 50. The thermocouple includes a thermocouple junction at tip 72, and insulated wiring 66 for connection to a current sensor (not shown) outside chamber 30. The wiring 66 is sheathed in nickel and has a diameter of about forty mils. A nickel ball 73 with a diameter of about eighty mils is located about 0.3 inches from tip 72. A ceramic keeper 160 keeps the thermocouple in hole 96 in ceramic member 50 by holding ball 73 in place.

As shown in FIG. 16, ceramic keeper 160 may be in the form of a somewhat rectangular block with rounded edges. The ceramic keeper can be formed of aluminum oxide. Ceramic keeper 160 can be about 0.15 inches high, 0.12 inches deep, and 0.45 inches wide. Ceramic keeper 160 also has a vertical rounded notch 162 about 0.07 inches deep and 0.05 inches wide. The surface 164 of ceramic keeper 160 will rest against ball 73, and wiring 66 will run through notch 162.

As shown in FIG. 17, the thermocouple is inserted through bore 156 so that thermocouple tip 72 is in hole 96 and wiring 66 trails out of bore 156. Then ceramic keeper 160 is inserted into bore 156 so that surface 164 rests against ball 73, a surface 160 of the ceramic keeper is flush with indents 153b and 153c, and wiring 66 runs through notch 162. Then washers 158b and 158c are placed in indents 153b and 153c to hold ceramic keeper 160 in bore 156. Finally, shouldered screws 68b and 68c are inserted through washers 158b and 158c and screwed into bores 152b and 152c.

As described above, the present invention is directed to a susceptor formed of a ceramic member (e.g., aluminum nitride) having an embedded conductive metal layer (e.g., molybdenum) to serve as an electrode. There are a number of apertures in the metal layer, and the ceramic is densified through the apertures to form a very sturdy susceptor. The ceramic and the electrical connector protect the metal layer from the corrosive environment in the deposition chamber. This provides a susceptor which has, at a reasonable cost, a long life-time as well as high resistance to thermal shock.

The present invention has been described in terms of a preferred embodiment. The invention, however, is not limited to the embodiment depicted and described. Rather, the scope of the invention is defined by the appended claims.

What is claimed is:

1. A susceptor for supporting a substrate during a deposition process, comprising:
    a ceramic member;
    a high melting-point conductive metal layer having a plurality of holes therein embedded in said ceramic member;
    an opening from a surface of said ceramic member to said metal layer;
    a conductive connector secured in said opening; and
    a brazing compound disposed between said conductive connector and said metal layer to form an electrical connection between said metal layer and said conductive connector;
    wherein said conductive connector is nickel, said metal layer is molybdenum, and said brazing compound contains aluminum, silicon and magnesium.

2. A susceptor for supporting a substrate in a deposition process, comprising
    a ceramic member;
    a high melting-point conductive metal layer having a plurality of holes therein embedded in said ceramic member;
    an opening from a surface of said ceramic member to said metal layer; and
    a conductive connector secured in said opening for establishing electrical contact with said metal layer, said conductive connector having a passageway extending to said metal layer.

3. A susceptor for supporting a substrate during a deposition process, comprising:

a ceramic member;

a high melting-point conductive metal layer having a plurality of holes therein embedded in said ceramic member;

an opening from a surface of said ceramic member to said metal layer;

a conductive connector secured in said opening; and a brazing compound disposed between said conductive connector and said metal layer to form an electrical connection between said metal layer and said conductive connector;

wherein said opening is grooved cylinder, said conductive connector is a threaded cylinder disposed in said opening.

4. A susceptor for supporting a substrate during a deposition process, comprising:

a ceramic member;

a high melting-point conductive metal layer having a plurality of holes therein embedded in said ceramic member;

an opening from a surface of said ceramic member to said metal layer;

a conductive connector secured in said opening; and a brazing compound disposed between said conductive connector and said metal layer to form an electrical connection between said metal layer and said conductive connector;

wherein said conductive connector has a passageway extending therethrough with an end adapted to receive a cable.

5. The susceptor of claim 4 further comprising a conductive cable inserted into said passageway.

6. The susceptor of claim 5 wherein a stopper on said cable is welded to said conductive connector to form a hermetic weld.

7. The susceptor of claim 6 further comprising a ceramic plug inserted in said passageway.

8. A susceptor for supporting a substrate during a deposition process, comprising:

a ceramic plate configured to support said substrate on a first surface;

a high melting-point conductive metal layer having a plurality of holes therein embedded in said ceramic plate;

a cylindrical opening from a second surface of said ceramic plate to said metal layer;

a threaded conductive cylinder secured in said opening for establishing electrical contact with said metal layer; and a brazing compound disposed between said conductive cylinder and said metal layer to form an electrical connection between said metal layer and said conductive cylinder.

9. A susceptor for supporting a substrate, comprising:

a ceramic member;

a metal electrode embedded in said ceramic member;

an opening from a surface of said ceramic member to said electrode; and a conductive terminal secured in said opening for establishing electrical contact with said electrode, said conductive terminal having a passageway therethrough extending to said electrode.

10. The susceptor of claim 9 further comprising a ceramic disk located at the bottom of said passageway.

11. The susceptor of claim 10 wherein a conductive cable is inserted into said passageway above said ceramic disk.

12. The susceptor of claim 11 wherein said conductive cable is welded to said terminal to form a hermetic seal to prevent a corrosive atmosphere from reaching said electrode through said passageway.

13. The susceptor of claim 10 further comprising a brazing material disposed between said ceramic disk and said electrode.

14. A susceptor for supporting a substrate, comprising:

a ceramic member;

a metal electrode embedded in said ceramic member;

an opening from a surface of said ceramic member to said electrode; and a conductive terminal secured in said opening for establishing electrical contact with said electrode, said conductive terminal having a threaded exterior surface.

15. The susceptor of claim 14 wherein the threaded exterior surface of said terminal engages said opening to prevent a corrosive atmosphere from reaching said electrode through a gap between said terminal and said ceramic member.

16. The susceptor of claim 14 further comprising a brazing material disposed between said terminal and said electrode, wherein said brazing material contains aluminum.

17. The susceptor of claim 14 wherein said terminal is a cylindrical tube having an inner cylindrical surface that defines said passageway to said electrode and an outer cylindrical surface that includes said threaded surface.

18. The susceptor of claim 14 wherein said opening is a cylindrical opening with a threaded interior surface.

19. A method of forming a susceptor, comprising:

isostatically pressing a high melting point conductive metal layer having a plurality of apertures therein between two green ceramic plates until cross-linking between said two ceramic plates occurs through said apertures to form a ceramic member in which said metal layer is embedded;

forming an opening from a surface of said ceramic member to said metal layer; and securing a conductive connector in said opening, said conductive connector including a passageway extending to said metal layer.

20. A method of forming a susceptor, comprising:

isostatically pressing a high melting point conductive metal layer having a plurality of apertures therein between two green ceramic plates until cross-linking between said two ceramic plates occurs through said apertures to form a ceramic member in which said metal layer is embedded;

forming a cylindrical opening from a surface of said ceramic member to said metal layer;

securing a conductive connector in said opening;

placing a brazing material at the bottom of said opening between said metal layer and said conductive connector; and heating said susceptor to braze said brazing material and form an electrical connection between said metal layer and said conductive connector.

21. The method of claim 20 further comprising inserting a ceramic plug into said opening to push said brazing material between any space between said conductive connector and said ceramic member.

22. The method of claim 9, wherein said conductive connector is a threaded cylinder.

* * * * *